(12) United States Patent
Young et al.

(10) Patent No.: US 12,212,353 B2
(45) Date of Patent: Jan. 28, 2025

(54) PREDISTORTION METHOD

(71) Applicant: Nokia Solutions and Networks Oy, Espoo (FI)

(72) Inventors: Chad Young, Dallas, TX (US); Tian He, Dallas, TX (US); Shavantha Kularatna, Dallas, TX (US); Peter Novak, Dallas, TX (US); Jacob Edward Longwell, Dallas, TX (US)

(73) Assignee: Nokia Solutions and Networks Oy, Espoo (FI)

( * ) Notice: Subject to any disclaimer, the term of this patent is extended or adjusted under 35 U.S.C. 154(b) by 21 days.

(21) Appl. No.: 18/351,623

(22) Filed: Jul. 13, 2023

(65) Prior Publication Data

US 2024/0022217 A1    Jan. 18, 2024

(30) Foreign Application Priority Data

Jul. 14, 2022    (FI) ..................... 20225668

(51) Int. Cl.
*H04B 1/04*    (2006.01)
*H03F 1/32*    (2006.01)

(52) U.S. Cl.
CPC ......... *H04B 1/0475* (2013.01); *H03F 1/3247* (2013.01); *H03F 2200/451* (2013.01); *H04B 2001/0425* (2013.01)

(58) Field of Classification Search
CPC .... H03F 1/3252; H03F 1/3258; H03F 1/3247; H03F 3/195; H03F 3/245;
(Continued)

(56) References Cited

U.S. PATENT DOCUMENTS 9,735,741 B2 *    8/2017    Pratt ................. H03F 3/245
9,866,269 B1    1/2018    Zhao et al.
(Continued)

FOREIGN PATENT DOCUMENTS

CN    104601511 A    5/2015
WO    2016/095528 A1    6/2016

OTHER PUBLICATIONS

Byrne et al., "Recursive Pre-Distorter for Hardware Efficient Digital Pre-Distortion", IEEE Topical Conference on RF/ Microwave Power Amplifiers for Radio and Wireless Applications (PAWR), Jan. 17-20, 2021, pp. 31-33.

(Continued)

*Primary Examiner* — Dac V Ha
(74) *Attorney, Agent, or Firm* — Nokia Technologies Oy

(57) ABSTRACT

As solution for predistorting a signal is presented. The solution comprises receiving (600) as an input a signal comprising at least two signal components on a different band, sampling (602) the input signal comprising linear terms, composite non-linear terms causing intermodulation outside Nyquist band of the input signal and further non-linear terms causing intermodulation inside the Nyquist band, the further non-linear terms comprising multi-band terms. Oversampling (604) by a given factor is applied to the signal in a first predistortion circuit for processing the linear terms and composite non-linear terms causing intermodulation outside Nyquist band; processing (606) the input signal without oversampling in a second predistortion circuit in parallel with the first predistortion circuit for the further non-linear terms. The rates of the output signals of the predistortion circuits are matched (608), combined and filtered (610).

11 Claims, 6 Drawing Sheets

(58) Field of Classification Search
CPC ......... H03F 2200/111; H03F 2200/451; H04B 1/0475; H04B 2001/0425; H04L 25/49; H04L 27/367
See application file for complete search history.

(56) References Cited

U.S. PATENT DOCUMENTS

| | | | |
|---|---|---|---|
| 10,224,970 | B2 | 3/2019 | Pratt |
| 10,396,723 | B1* | 8/2019 | Haas ..................... H03F 1/3258 |
| 2009/0124218 | A1 | 5/2009 | McCallister et al. |
| 2017/0338841 | A1 | 11/2017 | Pratt |
| 2020/0021478 | A1* | 1/2020 | Si ......................... H04B 1/0475 |
| 2020/0028476 | A1 | 1/2020 | Kim et al. |
| 2020/0382147 | A1 | 12/2020 | Menkhoff et al. |
| 2022/0368360 | A1* | 11/2022 | Menkhoff ............. H04L 27/368 |

OTHER PUBLICATIONS

Office action received for corresponding Finnish Patent Application No. 20225668, dated Nov. 11, 2022, 9 pages.
Office action received for corresponding Finnish Patent Application No. 20225668, dated May 5, 2023, 9 pages.
Extended European Search Report received for corresponding European Patent Application No. 23185190.8, dated Jan. 12, 2024, 12 pages.

* cited by examiner

PREDISTORTION METHOD

FIELD

The exemplary and non-limiting embodiments of the invention relate generally to wireless communication systems. The exemplary and non-limiting embodiments of the invention relate especially to apparatuses and methods in wireless communication networks.

BACKGROUND

In transmitters, for example base station transmitters used in wireless communication systems the trend is to use wide bandwidth transmitters which have the capability of transmitting utilising multiple Radio Frequency (RF) bands. Wide band radios are efficient allowing deploying a single base station as opposed to dedicating a separate base station for each band.

In transmitters, for example base station transmitters used in wireless communication systems, a power amplifier is used to amplify the signal to be transmitted to the required power level. Usually, power amplifiers are driven into compression for increasing the efficiency of the amplifier. This causes the distortion in the output signal of the amplifier. This distortion may be compensated by a digital pre-distortion. Using a wide bandwidth in transmission causes some problems in the realisation of predistortion.

SUMMARY

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to a more detailed description that is presented later.

According to an aspect of the present invention, there is provided an apparatus, comprising: at least one processor; and at least one memory including computer program code, the at least one memory and the computer program code configured to, with the at least one processor, cause the apparatus at least to perform: receive as an input a signal comprising at least two signal components, each signal component being received on a different frequency band; sample the input signal at a given sample frequency fs, the signal comprising linear terms, composite non-linear terms causing intermodulation outside Nyquist band of ±fs/2 of the input signal and further non-linear terms causing intermodulation inside the Nyquist band, the further non-linear terms comprising multi-band terms; apply oversampling by a given factor to the input signal in a first predistortion circuit for processing the linear terms and composite non-linear terms causing intermodulation outside Nyquist band; process the input signal without oversampling in a second predistortion circuit in parallel with the first predistortion circuit for the further non-linear terms causing intermodulation inside the Nyquist band; match the rates of the output signals of the first and second predistortion circuits; combine and filter the output signals of the first and second predistortion circuits to obtain a pre-distorted signal for a power amplifier.

According to an aspect of the present invention, there is provided a method comprising: receiving as an input a signal comprising at least two signal components, each signal component being received on a different frequency band; sampling the input signal at a given sample frequency fs, the signal comprising linear terms, composite non-linear terms causing intermodulation outside Nyquist band of ±fs/2 of the input signal and further non-linear terms causing intermodulation inside the Nyquist band, the further non-linear terms comprising multi-band terms; applying oversampling by a given factor to the input signal in a first predistortion circuit for processing the linear terms and composite non-linear terms causing intermodulation outside Nyquist band; processing the input signal without oversampling in a second predistortion circuit in parallel with the first predistortion circuit for the further non-linear terms causing intermodulation inside the Nyquist band; matching the rates of the output signals of the first and second predistortion circuits; combining and filtering the output signals of the first and second predistortion circuits to obtain a pre-distorted signal for a power amplifier.

According to an aspect of the present invention, there is provided a computer program comprising instructions for causing an apparatus to perform at least the following: receiving as an input a signal comprising at least two signal components, each signal component being received on a different frequency band; sampling the input signal at a given sample frequency fs, the signal comprising linear terms, composite non-linear terms causing intermodulation outside Nyquist band of ±fs/2 of the input signal and further non-linear terms causing intermodulation inside the Nyquist band, the further non-linear terms comprising multi-band terms; applying oversampling by a given factor to the input signal in a first predistortion circuit for processing the linear terms and composite non-linear terms causing intermodulation outside Nyquist band; processing the input signal without oversampling in a second predistortion circuit in parallel with the first predistortion circuit for the further non-linear terms causing intermodulation inside the Nyquist band; matching the rates of the output signals of the first and second predistortion circuits; combining and filtering the output signals of the first and second predistortion circuits to obtain a pre-distorted signal for a power amplifier.

An embodiment provides an apparatus comprising means for receiving as an input a signal comprising at least two signal components, each signal component being received on a different frequency band; means for sampling the input signal at a given sample frequency fs, the signal comprising linear terms, composite non-linear terms causing intermodulation outside Nyquist band of ±fs/2 of the input signal and further non-linear terms causing intermodulation inside the Nyquist band, the further non-linear terms comprising multi-band terms; means for applying oversampling by a given factor to the input signal in a first predistortion circuit for processing the linear terms and composite non-linear terms causing intermodulation outside Nyquist band; means for processing the input signal without oversampling in a second predistortion circuit in parallel with the first predistortion circuit for the further non-linear terms causing intermodulation inside the Nyquist band; means for matching the rates of the output signals of the first and second predistortion circuits; means for combining and filtering the output signals of the first and second predistortion circuits to obtain a pre-distorted signal for a power amplifier.

An embodiment provides a non-transitory computer program embodied on a distribution medium, comprising program instructions which, when loaded into an electronic apparatus, are configured to control the apparatus to execute at least the following: receiving as an input a signal comprising at least two signal components, each signal component being received on a different frequency band; sampling the input signal at a given sample frequency fs, the signal comprising linear terms, composite non-linear terms causing intermodulation outside Nyquist band of ±fs/2 of the input signal and further non-linear terms causing intermodulation inside the Nyquist band, the further non-linear terms comprising multi-band terms; applying oversampling by a given factor to the input signal in a first predistortion circuit for processing the linear terms and composite non-linear terms causing intermodulation outside Nyquist band; processing the input signal without oversampling in a second predistortion circuit in parallel with the first predistortion circuit for the further non-linear terms causing intermodulation inside the Nyquist band; matching the rates of the output signals of the first and second predistortion circuits; combining and filtering the output signals of the first and second predistortion circuits to obtain a pre-distorted signal for a power amplifier.

One or more examples of implementations are set forth in more detail in the accompanying drawings and the description below. Other features will be apparent from the description and drawings, and from the claims. The embodiments and/or examples and features, if any, described in this specification that do not fall under the scope of the independent claims are to be interpreted as examples useful for understanding various embodiments of the invention.

LIST OF DRAWINGS

Example embodiments of the present invention are described below, by way of example only, with reference to the accompanying drawings, in which FIGS. 1 and 2 illustrate examples of simplified system architecture of communication systems;

DESCRIPTION OF SOME EMBODIMENTS

The following embodiments are only examples. Although the specification may refer to "an", "one", or "some" embodiment(s) in several locations, this does not necessarily mean that each such reference is to the same embodiment(s), or that the feature only applies to a single embodiment. Single features of different example embodiments may also be combined to provide other embodiments. Furthermore, words "comprising" and "including" should be understood as not limiting the described embodiments to consist of only those features that have been mentioned and such embodiments may also contain features, structures, units, modules etc. that have not been specifically mentioned.

Some example embodiments of the present invention are applicable to a user terminal, a communication device, a base station, eNodeB, gNodeB, a distributed realisation of a base station, a network element of a communication system, a corresponding component, and/or to any communication system or any combination of different communication systems that support required functionality.

The protocols used, the specifications of communication systems, servers and user equipment, especially in wireless communication, develop rapidly. Such development may require extra changes to an embodiment. Therefore, all words and expressions should be interpreted broadly and they are intended to illustrate, not to restrict, embodiments.

In the following, different exemplifying embodiments will be described using, as an example of an access architecture to which the embodiments may be applied, a radio access architecture based on long term evolution advanced (LTE Advanced, LTE-A) or new radio (NR, 5G), without restricting the embodiments to such an architecture, however. The embodiments may also be applied to other kinds of communications networks having suitable means by adjusting parameters and procedures appropriately. Some examples of other options for suitable systems are the universal mobile telecommunications system (UMTS) radio access network (UTRAN), wireless local area network (WLAN or WiFi), worldwide interoperability for microwave access (WiMAX), Bluetooth®, personal communications services (PCS), ZigBee®, wideband code division multiple access (WCDMA), systems using ultra-wideband (UWB) technology, sensor networks, mobile ad-hoc networks (MANETs) and Internet Protocol multimedia subsystems (IMS) or any combination thereof.

Figure 1:
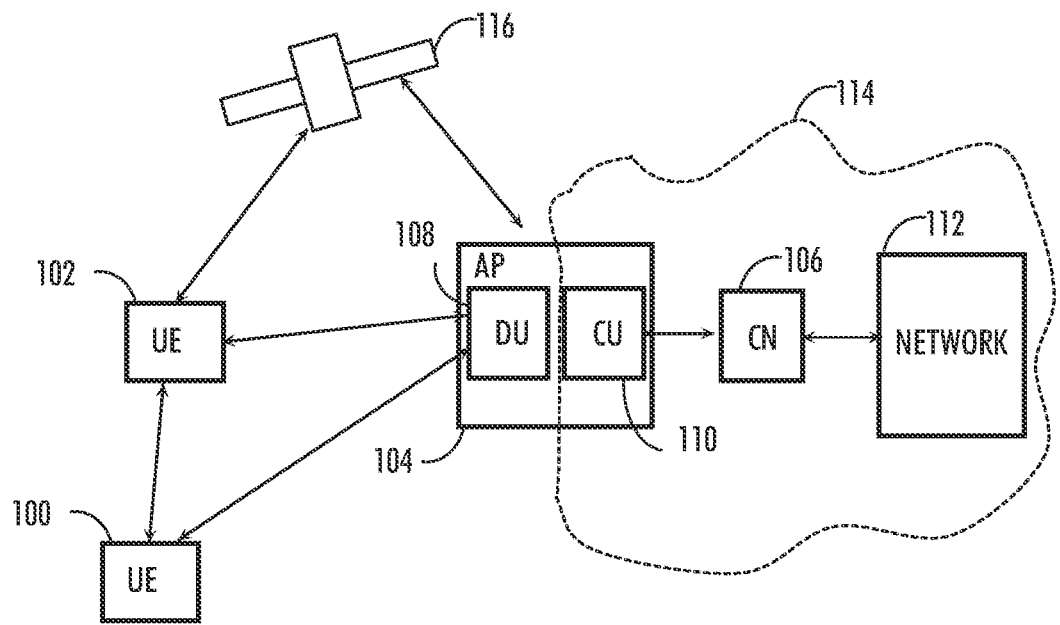

FIG. 1 depicts examples of simplified system architectures only showing some elements and functional entities, all being logical units, whose implementation may differ from what is shown. The connections shown in FIG. 1 are logical connections; the actual physical connections may be different. It is apparent to a person skilled in the art that the system typically comprises also other functions and structures than those shown in FIG. 1.

The example embodiments are not, however, restricted to the system given as an example but a person skilled in the art may apply the solution to other communication systems provided with necessary properties.

The example of FIG. 1 shows a part of an exemplifying radio access network.

FIG. 1 shows devices 100 and 102. The devices 100 and 102 are configured to be in a wireless connection on one or more communication channels with a node 104. The node 104 is further connected to a core network 106. In one example, the node 104 may be an access node such as (e/g)NodeB serving devices in a cell. In one example, the node 104 may be a non-3GPP access node. The physical link from a device to a (e/g)NodeB is called uplink or reverse link and the physical link from the (e/g)NodeB to the device is called downlink or forward link. It should be appreciated that (e/g)NodeBs or their functionalities may be implemented by using any node, host, server or access point etc. entity suitable for such a usage.

A communications system typically comprises more than one (e/g)NodeB in which case the (e/g)NodeBs may also be configured to communicate with one another over links, wired or wireless, designed for the purpose. These links may be used for signalling purposes. The (e/g)NodeB is a computing device configured to control the radio resources of communication system it is coupled to. The NodeB may also be referred to as a base station, an access point or any other type of interfacing device including a relay station capable of operating in a wireless environment. The (e/g)NodeB includes or is coupled to transceivers. From the transceivers of the (e/g)NodeB, a connection is provided to an antenna unit that establishes bi-directional radio links to devices. The antenna unit may comprise a plurality of antennas or antenna elements. The (e/g)NodeB is further connected to the core network 106 (CN or next generation core NGC). Depending on the deployed technology, the (e/g)NodeB is connected to a serving and packet data network gateway (S-GW+P-GW) or user plane function (UPF), for routing and forwarding user data packets and for providing connectivity of devices to one ore more external packet data networks, and to a mobile management entity (MME) or access mobility management function (AMF), for controlling access and mobility of the devices.

Exemplary embodiments of a device are a subscriber unit, a user device, a user equipment (UE), a user terminal, a terminal device, a mobile station, a mobile device, etc The device typically refers to a mobile or static device (e.g. a portable or non-portable computing device) that includes wireless mobile communication devices operating with or without an universal subscriber identification module (USIM), including, but not limited to, the following types of devices: mobile phone, smartphone, personal digital assistant (PDA), handset, device using a wireless modem (alarm or measurement device, etc.), laptop and/or touch screen computer, tablet, game console, notebook, and multimedia device. It should be appreciated that a device may also be a nearly exclusive uplink only device, of which an example is a camera or video camera loading images or video clips to a network. A device may also be a device having capability to operate in Internet of Things (IoT) network which is a scenario in which objects are provided with the ability to transfer data over a network without requiring human-to-human or human-to-computer interaction, e.g. to be used in smart power grids and connected vehicles. The device may also utilise cloud. In some applications, a device may comprise a user portable device with radio parts (such as a watch, earphones or eyeglasses) and the computation is carried out in the cloud.

The device illustrates one type of an apparatus to which resources on the air interface are allocated and assigned, and thus any feature described herein with a device may be implemented with a corresponding apparatus, such as a relay node. An example of such a relay node is a layer 3 relay (self-backhauling relay) towards the base station. The device (or in some embodiments a layer 3 relay node) is configured to perform one or more of user equipment functionalities.

Various techniques described herein may also be applied to a cyber-physical system (CPS) (a system of collaborating computational elements controlling physical entities). CPS may enable the implementation and exploitation of massive amounts of interconnected information and communications technology, ICT, devices (sensors, actuators, processors microcontrollers, etc.) embedded in physical objects at different locations. Mobile cyber physical systems, in which the physical system in question has inherent mobility, are a subcategory of cyber-physical systems. Examples of mobile physical systems include mobile robotics and electronics transported by humans or animals.

Additionally, although the apparatuses have been depicted as single entities, different units, processors and/or memory units (not all shown in FIG. 1) may be implemented.

5G enables using multiple input-multiple output (MIMO) antennas, many more base stations or nodes than the LTE (a so-called small cell concept), including macro sites operating in co-operation with smaller stations and employing a variety of radio technologies depending on service needs, use cases and/or spectrum available. 5G mobile communications supports a wide range of use cases and related applications including video streaming, augmented reality, different ways of data sharing and various forms of machine type applications (such as (massive) machine-type communications (mMTC), including vehicular safety, different sensors and real-time control. 5G is expected to have multiple radio interfaces, e.g. below 6 GHz or above 24 GHz, cmWave and mmWave, and also being integrable with existing legacy radio access technologies, such as the LTE. Integration with the LTE may be implemented, at least in the early phase, as a system, where macro coverage is provided by the LTE and 5G radio interface access comes from small cells by aggregation to the LTE. In other words, 5G is planned to support both inter-RAT operability (such as LTE-5G) and inter-RI operability (inter-radio interface operability, such as below 6 GHz-cmWave, 6 or above 24 GHz-cmWave and mmWave). One of the concepts considered to be used in 5G networks is network slicing in which multiple independent and dedicated virtual sub-networks (network instances) may be created within the same infrastructure to run services that have different requirements on latency, reliability, throughput and mobility.

The current architecture in LTE networks is fully distributed in the radio and fully centralized in the core network. The low latency applications and services in 5G require to bring the content close to the radio which leads to local break out and multi-access edge computing (MEC). 5G enables analytics and knowledge generation to occur at the source of the data. This approach requires leveraging resources that may not be continuously connected to a network such as laptops, smartphones, tablets and sensors. MEC provides a distributed computing environment for application and service hosting. It also has the ability to store and process content in close proximity to cellular subscribers for faster response time. Edge computing covers a wide range of technologies such as wireless sensor networks, mobile data acquisition, mobile signature analysis, cooperative distributed peer-to-peer ad hoc networking and processing also classifiable as local cloud/fog computing and grid/mesh computing, dew computing, mobile edge computing, cloudlet, distributed data storage and retrieval, autonomic self-healing networks, remote cloud services, augmented and virtual reality, data caching, Internet of Things (massive connectivity and/or latency critical), critical communications (autonomous vehicles, traffic safety, real-time analytics, time-critical control, healthcare applications).

The communication system is also able to communicate with other networks 112, such as a public switched telephone network, or a VoIP network, or the Internet, or a private network, or utilize services provided by them. The communication network may also be able to support the usage of cloud services, for example at least part of core network operations may be carried out as a cloud service (this is depicted in FIG. 1 by "cloud" 114). The communication system may also comprise a central control entity, or a like, providing facilities for networks of different operators to cooperate for example in spectrum sharing.

The technology of Edge cloud may be brought into a radio access network (RAN) by utilizing network function virtualization (NFV) and software defined networking (SDN). Using the technology of edge cloud may mean access node operations to be carried out, at least partly, in a server, host or node operationally coupled to a remote radio head or base station comprising radio parts. It is also possible that node operations will be distributed among a plurality of servers, nodes or hosts. Application of cloudRAN architecture enables RAN real time functions being carried out at or close to a remote antenna site (in a distributed unit, DU 108) and non-real time functions being carried out in a centralized manner (in a centralized unit, CU 110).

It should also be understood that the distribution of labour between core network operations and base station operations may differ from that of the LTE or even be non-existent. Some other technology advancements probably to be used are Big Data and all-IP, which may change the way networks are being constructed and managed. 5G (or new radio, NR) networks are being designed to support multiple hierarchies, where MEC servers can be placed between the core and the base station or nodeB (gNB). It should be appreciated that MEC can be applied in 4G networks as well. 5G may also utilize satellite communication to enhance or complement the coverage of 5G service, for example by providing backhauling. Possible use cases are providing service continuity for machine-to-machine (M2M) or Internet of Things (IoT) devices or for passengers on board of vehicles, Mobile Broadband, (MBB) or ensuring service availability for critical communications, and future railway/maritime/aeronautical communications. Satellite communication may utilise geostationary earth orbit (GEO) satellite systems, but also low earth orbit (LEO) satellite systems, in particular mega-constellations (systems in which hundreds of (nano)satellites are deployed). Each satellite in the mega-constellation may cover several satellite-enabled network entities that create on-ground cells. The on-ground cells may be created through an on-ground relay node or by a gNB located on-ground or in a satellite.

It is obvious for a person skilled in the art that the depicted system is only an example of a part of a radio access system and in practice, the system may comprise a plurality of (e/g)NodeBs, the device may have an access to a plurality of radio cells and the system may comprise also other apparatuses, such as physical layer relay nodes or other network elements, etc. At least one of the (e/g)NodeBs or may be a Home(e/g)nodeB. Additionally, in a geographical area of a radio communication system a plurality of different kinds of radio cells as well as a plurality of radio cells may be provided. Radio cells may be macro cells (or umbrella cells) which are large cells, usually having a diameter of up to tens of kilometers, or smaller cells such as micro-, femto- or picocells. The (e/g)NodeBs of FIG. 1 may provide any kind of these cells. A cellular radio system may be implemented as a multilayer network including several kinds of cells. Typically, in multilayer networks, one access node provides one kind of a cell or cells, and thus a plurality of (e/g) NodeBs are required to provide such a network structure.

For fulfilling the need for improving the deployment and performance of communication systems, the concept of "plug-and-play" (e/g)NodeBs has been introduced. Typically, a network which is able to use "plug-and-play" (e/g)Node Bs, includes, in addition to Home (e/g)NodeBs (H(e/g)nodeBs), a home node B gateway, or HNB-GW (not shown in FIG. 1). A HNB Gateway (HNB-GW), which is typically installed within an operator's network may aggregate traffic from a large number of HNBs back to a core network.

Figure 2:
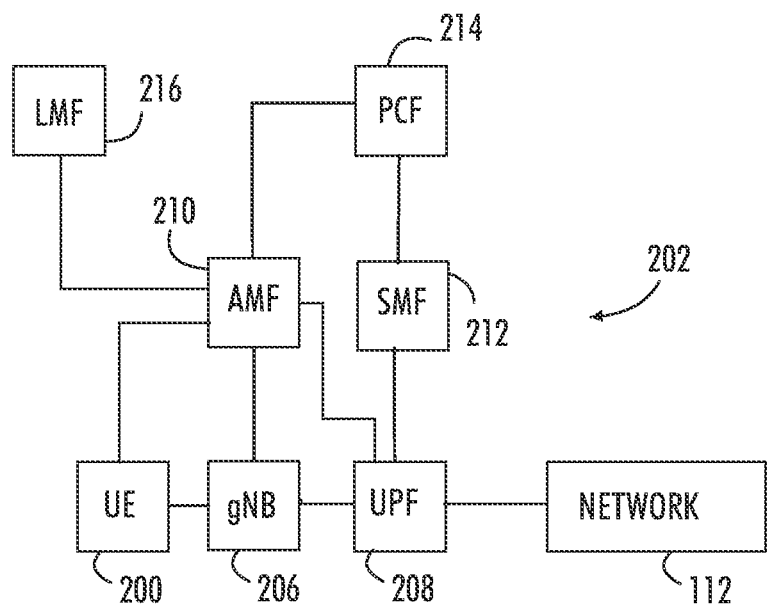

FIG. 2 illustrates an example of a communication system based on 5G network components. A terminal device, user terminal or user equipment 200 communicating via a 5G network 202 with a data network 112. The user terminal 200 is connected to a Radio Access Network RAN node, such as (e/g)NodeB 206 which provides the user terminal with a connection to the network 112 via one or more User Plane Functions, UPF 208. The user terminal 200 is further connected to Core Access and Mobility Management Function, AMF 210, which is a control plane core connector for (radio) access network and can be seen from this perspective as the 5G version of Mobility Management Entity, MME, in LTE. The 5G network further comprises Session Management Function, SMF 212, which is responsible for subscriber sessions, such as session establishment, modify and release, and a Policy Control Function, PCF 214 which is configured to govern network behavior by providing policy rules to control plane functions. The 5G network may further comprise a location management function, LMF 216, which may be configured to determine the location of the terminal device 200 based on information received from the terminal device and/or gNB 206.

As mentioned, the trend in transmitter design is to utilise wide bandwidth transmitters because they may offer savings in costs as the number of transmitters may be reduced.

Figure 3A:
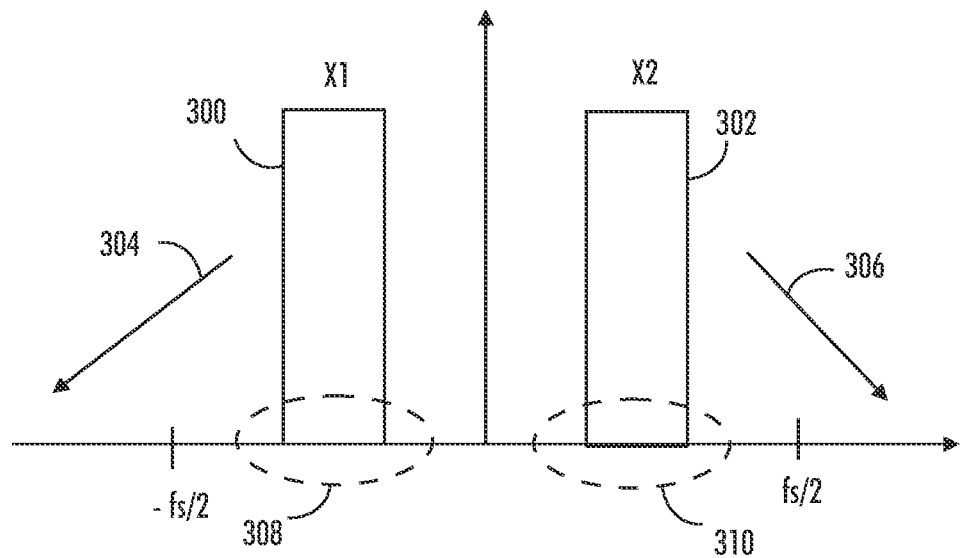
FIGS. 3A, 3B and 3C illustrate examples of some common signal configurations.
Figure 3B:
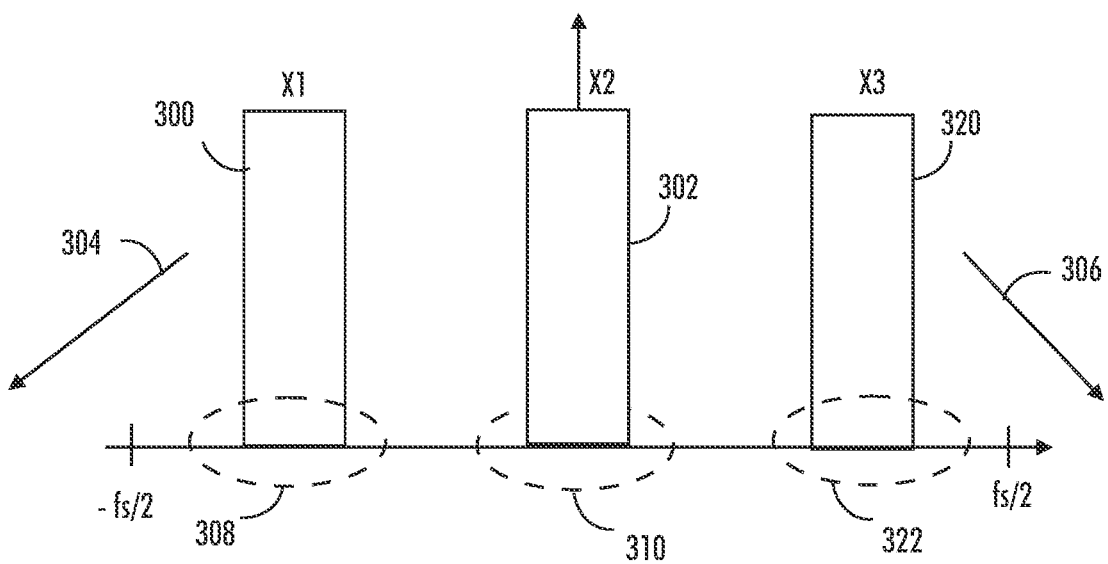
Figure 3C:
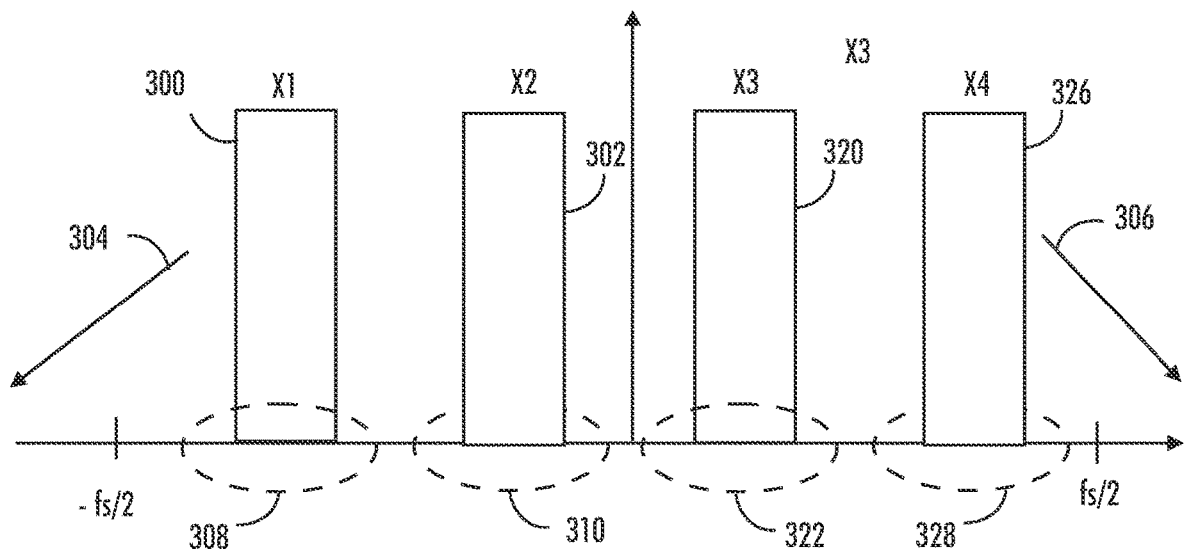

Base stations with wide bandwidth support are capable of transmitting on one or more transmission bands at the same time. In each of the bands, a random carrier configuration may be assigned to the base station. FIGS. 3A, 3B and 3C illustrate examples of some common signal configurations for Dual, Triple and Quad Band cases where the base station supports all the bands with a single power amplifier, PA. For simplicity, only a single carrier is shown per band. However, the problem or the solution described here in will not change if multiple carriers were assigned per each band FIG. 3A illustrates a dual band example. Two bands X1 300 and X2 302 are used. Intermodulations, IMs, due to low order non-linear cross terms 308, 310 (or some low order special terms) occur near the signals. Thus, a power amplifier model supporting these terms will not alias as they are within the Nyquist bandwidth defined within −fs/2 to fs/2, where fs the sampling rate of the signal. In some signal configurations third order terms may not alias. Third, fifth, seventh and the rest of higher order intermodulations 304, 306 are outside of −fs/2 and fs/2 and they alias. It may be noted that these alias terms may include high order dual and high order special terms as well.

FIG. 3B illustrates a triple band example. Three bands X1 300, X2 302 and X3 320 are used. Intermodulations, IMs, due to low order non-linear cross terms 308, 310, 322 (or some low order special terms) occur near the signals.

FIG. 3C illustrates a quad band example. Four bands X1 300, X2 302, X3 320 and X4 326 are used. Intermodulations, IMs, due to low order non-linear cross terms 308, 310, 322, 326, 328 (or some low order special terms) occur near the signals.

In a transmitter supporting wide bandwidth, the predistortion is more difficult to realise than in a narrow bandwidth transmitter. Typically, the solution to predistortion problem requires allocating increased hardware resources for the Digital Pre-Distortion, DPD, algorithm. However, this is challenging since there are limitations in application specific integrated circuits, ASICs used in the pre-distorting. ASICs consist of fixed hardware allocations for DPD. In the case of an Field Programmable Gate Array, FPGA, the solution may even opt for a newer FPGA with high number of gates.

Figure 4:
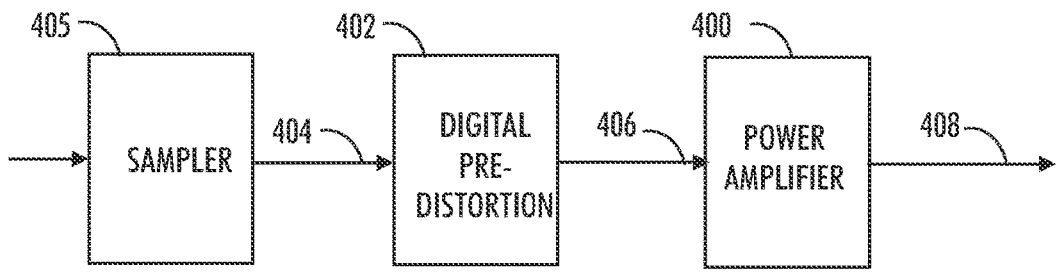
FIG. 4 illustrates an example of a transmission chain.

FIG. 4 illustrates an example of a transmission chain. The example shows a power amplifier 400, PA, and a digital predistortion circuit 402. The transmission chain may be a part of a base station, eNB, or gNB transceiver, or any other transceiver or transmitter.

The transmission chain receives as an input a signal 404 sampled by a sampler 405 at a given sample frequency fs, the signal comprising a linear vector, composite non-linear terms causing intermodulation outside Nyquist band within −fs/2 to fs/2 of the input signal and further non-linear terms causing intermodulation inside the Nyquist band;

The digital predistortion circuit 402 applies a predistortion PreD(n) to the input signal. Typically, the predistortion is the inverse of the power amplifier model of the PA 400. The pre-distorted signal 406 is taken to the PA which amplifies the signal to generate amplified signal 408.

Power amplifier intermodulation terms are related to the pre-distortion process such that the intermodulation terms given in the PA model are rotated 180 degrees (reversal of the sign).

A typical PA model may be defined as:

$$\text{PA model}(n) = \overline{L} * \overline{x(n)} + \overline{C} * \overline{NL(x)} \quad \text{(Eq.1)}$$

where
$\overline{x(n)}$ = desired signal vector with memory
$\overline{L}$ = linear coefficient vector of the PA.
$\overline{NL}$ = Non linear vector model. This will create IM products based on the input signal $\overline{x(n)}$. Vector terms include memory terms although they are not explicitly stated.
$\overline{C}$ = associated PA coefficient vector Associated digital pre-distortion, PDP, model corresponding to the above PA model may defined as:

$$\text{PreD}(n) = \overline{P} * \overline{x(n)} - \overline{D} * \overline{NL(x)} \quad \text{(Eq.2)}$$

where
$\overline{P}, \overline{D}$ are the associated DPD linear and non-linear coefficient vectors.

Nonlinear vector coefficients in Eqs. 1 and 2 can be close with relation to their magnitudes. It may be further noted that the IM component ($\overline{NL}$) of Eq. 2 has inverse sign compared to the PA model in Eq. 1.

In the example case of dual band, such as FIG. 3A, it is possible to split the composite signal x(n) to two parts:

$$x(n) = x1(n) + x2(n) \quad \text{(Eq.3)}$$

Likewise, the corresponding non-linear components in the dual band case can then be written as:

$$\overline{NL} = NL_{term1} + NL_{term2} + NL_{term3} + NL_{term4} \quad \text{(Eq.4)}$$

where $$NL_{term1} = x(n)|x(n)|^{2n} \text{(composite non linear term)} \quad \text{(Eq.5)}$$

$$NL_{term2} = x1(n)|x1(n)|^2 \quad \text{(Eq.6)}$$

$$NL_{term3} = x1(n)|x2(n)|^2 \quad \text{(Eq.7)}$$

$$NL_{term4} = x1(n)(\text{Conj}(x2(n))^2 \quad \text{(Eq.8)}$$

$$NL_{term5} = \text{conj}(x1(n))|x2(n)|^2 \quad \text{(Eq.9)}$$

The above can be easily extended to quad band example. As an example, extra terms near x1(n) can be added as follows:

$$\text{Extra terms} = x1(n)|x3(n)|^2, x1(n)|x4(n)|^2 \quad \text{(Eq.10)}$$

x1(n) (Conj(x3(n))$^2$, x1(n) (Conj(x4(n))$^2$, conj(x1(n))|x3(n)|$^2$, conj(x1(n))|x3(n)|$^2$ Terms near x2(n),x3(n),x4(n) may be written following the same methodology.

The terms listed above are an example and the example embodiments of the invention are not limited to the listed terms.

It may be further noted that the term $NL_{term1}$ in Eq.4 can be expanded further for n=1, 2, 3, . . . , i.e., for third, fifth, seventh order IM components. As FIGS. 3A, 3B and 3C illustrate, these IM components generated from the PA model consist of a wider frequency span causing them to place beyond the Nyquist frequency (−fs/2 to fs/2). Hence, aliasing would occur for those terms.

As Eq.1 and Eq.2 show with sign reversed IM terms, the PA model and the DPD model are related. Therefore, aliasing of IM components of the PA model will cause the pre-distorted signal to alias as well. For $NL_{term1}$ with n=1, 2, 3, . . . , wider frequency IMs are generated, etc. With larger values of n, some of those aliased products will fold back to frequencies near x1(n), and x2(n). These cannot be filtered out with either analog or digital filtering. Hence these aliased components can violate the emission masks.

A traditional solution is to oversample the input signal x(n) and its components x1(n), and x2(n) to a high sample rate before computing the non-linear terms. However, this is problematic from hardware realisation point of view. It is not without consequences, as doubling of the sampling rate will double the used hardware gates in an FPGA or an ASIC environment.

When oversampling is utilised, the input signal is oversampled by a factor of two, three or four as long as IM products don't alias. There are a few common methods to oversampling a signal. In the first oversampling method, zeros are inserted between samples followed up with low-pass filtering. Oversampling of two requires single zeros to be inserted. In the second oversampling method, which is preferred within an ASIC, an additional phase (i.e. x(n−0.5)) is created to oversample by two. Alternatively additional phases x(n−0.25), x(n−0.5) and x(n−0.75) may be created to oversample by 4.

The latter HW based oversampling may be illustrated by following equations:

$$x_{up}(n) = x(n) + f(x(n)) = x_0(n) + x_1(n) \quad \text{(Eq.11)}$$

where $$x(n-0.5) = f(x(n)) = x_1(n) \quad \text{(Eq.12)}$$

Here, f denotes a fractional delay filter, having a filter response which induces a group delay of 0.5 samples. Thus, it generates half a sample shift to x(n). The mentioned preferred HW based oversampling by 2 maintains two signal phases $x_0(n)$, and $x_1(n)$. These samples have an offset of 0.5 samples with relation to each other. Individually, each of the phases are sampled at fs where collectively, when interleaved as in (Eq.11), both phases as in $x_{up}(n)$ achieve an effective sample rate of 2*fs.

The advantage of the above mentioned HW based oversampling is that it does not require HW gates to clock at a higher rate (2*fs, for example) to achieve an oversampled signal. This technique, when achieving an oversampling ratio of two, may be denoted as dual data rate, DDR. Correspondingly, an oversampling by a factor four may be denoted as quad data rate QDR (Quad Data Rate). Similarly, a sampling ratio of one may be denoted as single data rate, SDR.

The cost of oversampling for a single non-linear term is illustrated in following equations:

$$NL_{up} = NL_{term1}(n) + NL_{term1}(n-0.5) = NL_0(n) + NL_1(n) \quad \text{(Eq. 13)}$$

where for phase1: $NL_1(n) = NL_{term1}(n-0.5) = x_1(n)|x_1(n)|^{2n}$. Thus, Eq.13 may be written as $$NL_{up} = x_0(n)|x_0(n)|^{2n} + x_1(n)|x_1(n)|^{2n} \quad \text{(Eq.14)}$$

As the above equation shows, a DDR implementation of a single non-linear NL term requires two times the HW resources (or two dedicated HW blocks) compared to an SDR non-linear term.

A SDR based pre-distorted signal consisting of NL elements can now be written in following form:

$$\text{PreD} = \overline{L} * \overline{x_0(n)} - \overline{D} * [\overline{NL_0}] \quad \text{(Eq.15)}$$

where $[\overline{NL_0}]$ is the non-linear SDR vector having a form: $[\overline{NL_0}]=[NL_{term10}NL_{term20}NL_{term30}NL_{term40}NL_{term50}]$ and D is the DPD coefficient vector.

In a similar manner, a DDR based pre-distorted signal can now be written in following form:

$$PreD_{up}=(\overline{L_0}*\overline{x_0(n)}+L_1*\overline{x_1(n)})+\overline{D_0}*[\overline{NL_0}]+\overline{D_1}*[\overline{NL_1}] \quad (Eq.16)$$

where $[\overline{NL_1}]$ can be written as:

$$[\overline{NL_1}]=[NL_{term11}NL_{term21}NL_{term31}NL_{term41}NL_{term51}]$$

Based on (Eq.16), it can be seen that the DDR model of the predistortion signal $PreD_{up}$ requires twice the HW resources compared to the SDR based PreD. Excluding the linear terms $(\overline{x_0(n)}+\overline{x_1(n)})$, which are mandatory for the DDR option, the non-linear terms will be doubled between the two phases. There will be ten non-linear terms DDR compared to five non-linear terms in SDR.

In a fixed HW setting, where clocks (or sampling rate is fixed), a DDR implementation of the pre-distortion signal may require HW resources that the ASIC or FPGA may not have. Other possibility is to reduce the terms to match the available HW resources within the ASIC or the FPGA. Thus, a degradation is expected in that instance.

Figure 5:
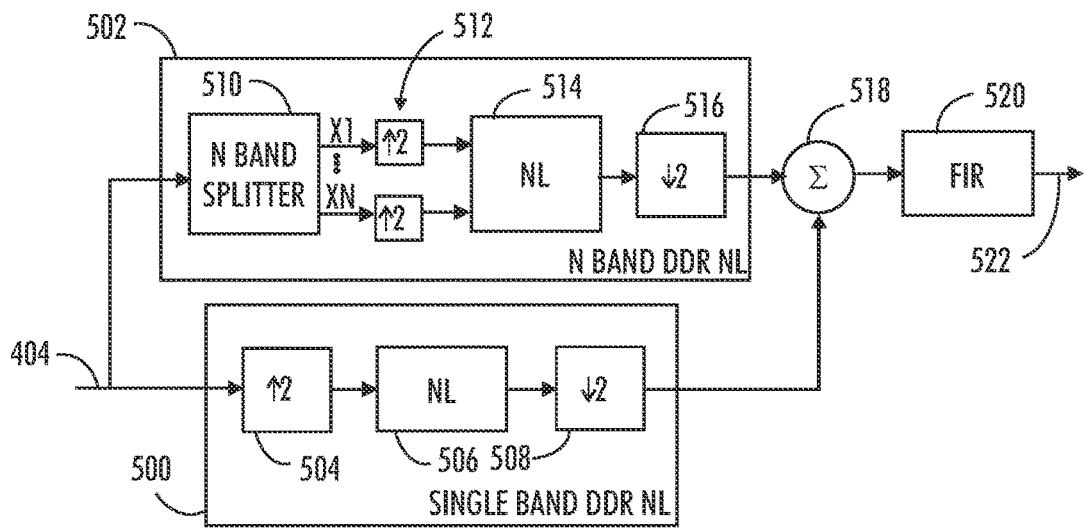
FIG. 5 illustrates an example of a prior art apparatus.

FIG. 5 illustrates an example of an apparatus which is one possible realisation of Eq.16. The input may be a signal 404 sampled at a given sample frequency fs. The apparatus of FIG. 5 comprises a composite single band DDR block 500 and an N band DDR block 502. Eq. 16 comprises an $[\overline{NL_0}]$ term comprises both composite and multi-band terms. It may be noted that the term multi-band terms is used to represent both cross and special terms. Eq. 16 further comprises an $[\overline{NL_1}]$ term (corresponding to DDR Phase 1). The non-linear element 506 after oversampler 504 within the DPD block 500 processes the composite terms of phase 0 and phase 1. The output of the non-linear element 506 is then decimated in 508. The non-linear element 514 after the band splitter 510 and oversampling 512 processes multi-band terms of phase 0 and phase 1. After the non-linear element 514 the signal is decimated 516 before supplying it to the summing element 518 where the outputs of blocks 500 and 502 are combined before filtering 520, and pre-distortion signal 522 at SDR rate is obtained. Before decimation composite terms and multi band terms are both operated at DDR.

Eq. 16 and thus the apparatus of FIG. 5 requires doubling of the non-linear terms for the cross and special products (Eq.7-Eq. 9). it may be noted that the inputs to the blocks 500, 502 are SDR and within the blocks the sample rate is doubled (DDR). Henceforth, the need for twice as many non-linear elements.

If the sample rate were quadrupled, then the blocks 500, 502 would require four times as many non-linear elements. Since ASICs or FGPAs have fixed hardware resources, the realisations of Eq.16 may not be able achieve the DPD complexity needed to meet emission requirements.

Figure 6:
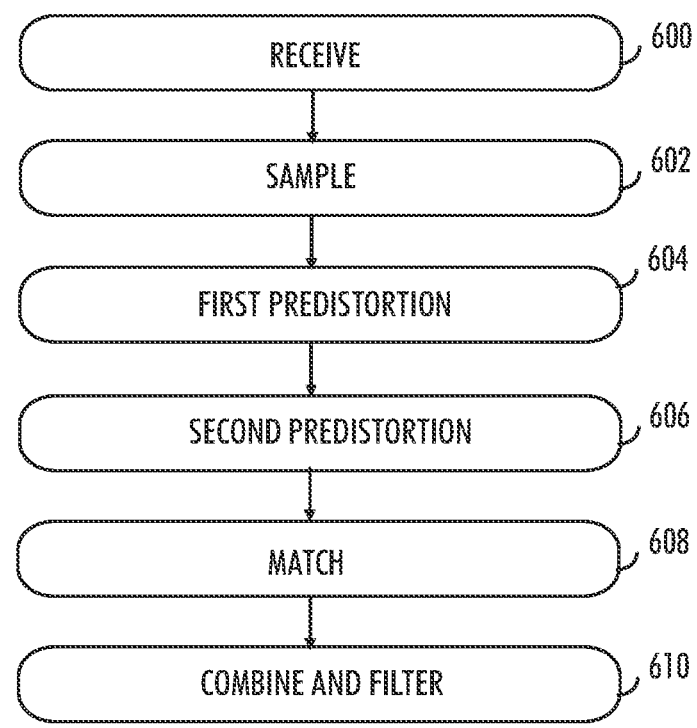
FIG. 6 is a flowchart illustrating an embodiment of the invention.

The flowchart of FIG. 6 illustrates an example embodiment. The flowchart illustrates an example of the operation of an apparatus or entity configured to perform predistortion of a signal forwarded to a power amplifier.

In step 600, the apparatus is configured receive as an input a signal comprising at least two signal components, each signal component being received on a different frequency band.

In step 602, the apparatus is configured to sample the input signal at a given sample frequency fs, the signal comprising linear terms, composite non-linear terms causing intermodulation outside Nyquist band of ±fs/2 of the input signal and further non-linear terms causing intermodulation inside the Nyquist band, the further non-linear terms comprising multi-band terms.

In step 604, the apparatus is configured to apply oversampling by a given factor to the input signal in a first predistortion circuit for processing the linear terms and composite non-linear terms causing intermodulation outside Nyquist band. The factor may be dual triple or quad, for example.

In step 606, the apparatus is configured to process the input signal without oversampling in a second predistortion circuit in parallel with the first predistortion circuit for the further non-linear terms causing intermodulation inside the Nyquist band.

In step 608, the apparatus is configured to match the rates of the output signals of the first and second predistortion circuits.

In step 610, the apparatus is configured to combine and filter the output signals of the first and second predistortion circuits to obtain a pre-distorted signal for a power amplifier.

The proposed solution of FIG. 6 preserves the HW resources by reducing the number of oversampled operations done, compared to the solution of FIG. 5, for example. For an up-sampling factor of two, the prior art solution of FIG. 5 requires using DDR rate for all non-linear terms including $NL_{term2}$, $NL_{term3}$, $NL_{term4}$, and $NL_{term5}$. In contrast, the proposed solution requires only doubling of HW resources for the linear terms $(\overline{x(n)})$ and the composite non-linear terms $NL_{term1}=x(n)|x(n)|^{2n}$. Thus, a minimum increment of HW resources is achieved. All other special terms such as $NL_{term2}$, $NL_{term3}$, $NL_{term4}$, and $NL_{term5}$ can be operated at SDR rates.

As FIGS. 3A to 3C show, the composite non-linearity causes aliasing since IMs produced by them are placed outside the Nyquist band −fs/2−+fs/2. However, other special terms ($NL_{term2}$ through $NL_{term5}$) create intermodulation products well within the Nyquist band. They are commonly denoted as near cross term locations, 308, 310, 322, 328 in FIGS. 3A to 3C. It can be observed that prior art solution is being inefficient since it indiscriminately doubles the HW resources for all the terms as Eq. 16 shows. However, the proposed solution utilises the fact that special terms ($NL_{term2}$ through $NL_{term5}$) are low order and they are unlikely to alias.

Following equation describes the operation of FIG. 6:

$$PreD_{up}=(\overline{L_0}*\overline{x_0(n)}+\overline{L_1}*\overline{x_1(n)})+\overline{C_0}*NL_{term10}+ \overline{C_1}*NL_{term11}+\overline{C_2}*\overline{NL_{SDR}}+f(\overline{C_2}*\overline{NL_{SDR}}) \quad (Eq. 17)$$

where
$\overline{x_0(n)}$=Phase 0 linear signal vector with memory
$\overline{x_1(n)}$=Phase 1 linear signal vector with memory
$NL_{term10}$=Phase 0 composite non linear term (Eq. 5)
$NL_{term11}$=Phase 1 composite non linear term (Eq. 5)
$\overline{NL_{SDR}}=[NL_{term2}\ NL_{term3}\ NL_{term4}\ NL_{term5}]$: Nonlinear SDR vector
$f(\overline{C_2}*\overline{NL_{SDR}})$ is same term as above but shifted with 0.5 samples to rate match with phase 1.
$\overline{L_0}, \overline{L_1}, \overline{C_0}, \overline{C_1}, \overline{L_0}, \ldots$ are coefficient vectors.

The solution according to Eq.17 achieves the same performance as the prior art DDR solution described in Eq.16. In addition, with the solution of Eq.17 it is possible to save the 4 resource blocks that were used to double up sampling rate of $\overline{NL_{SDR}}$ vector. An additional filter f is used in this option to create the phase 1 vector of $\overline{NL_{SDR}}$. This is only used to achieve a sample rate to match with rest of the terms where they consist of both phases.

In an example embodiment, the hardware blocks that are save by applying the solution of Eq.17 may be used to introduce new special (cross terms). Thus, an improvement in the DPD performance relative to the typical DDR solution is achieved. With the simplified example shown above 4 additional cross terms can be added for improved performance. Typical savings and the corresponding addition of new terms in practical transceivers can be as high as 20 HW resource blocks.

Figure 7:
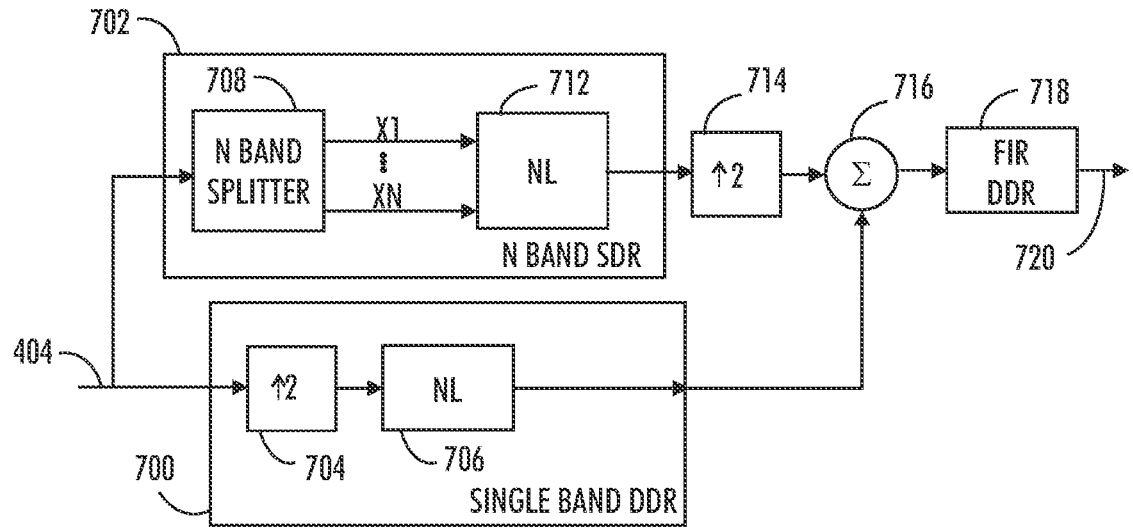
FIGS. 7 and 8 illustrates examples of apparatus of some example embodiments.

FIG. 7 illustrates an example of an apparatus which is one possible realisation of Eq.17. The input may be a signal 404 sampled at a given sample frequency fs. The apparatus of FIG. 7 comprises a first predistortion circuit or a composite single band DDR block 700 and a second predistortion circuit or an N band SDR block 702 which operate in parallel. Eq. 17 comprises an $[\overline{NL_{10}}]$ term (corresponding to DDR Phase 0) and an $[\overline{NL_{11}}]$ term (corresponding to DDR Phase 1), and these are realised with non-linear element 706 within the first predistortion DDR circuit 700 after the oversampler 704. The $[\overline{NL_{SDR}}]$ terms of Eq.17 are realized non-linear element 712 after the band splitter 708 within the second predistortion SDR circuit 502. In an example embodiment, the oversampling block 714 may be realised with the second oversampling method mentioned above, where phase 0 signal is used to generate a phase 1 signal with the help of a fractional delay filter (such as $f(\overline{C_2}*\overline{NL_{SDR}})$). Collectively both phases achieve a DDR rate.

The SDR terms from second predistortion circuit 702 are oversampled 714 so that they can be summed 716 with the DDR terms from the first predistortion circuit 700. Finally, the signal is filtered to obtain pre-distortion signal 720 at DDR rate. Before the summation 716, both linear, composite, and special (cross) terms are rate matched to DDR.

Figure 8:
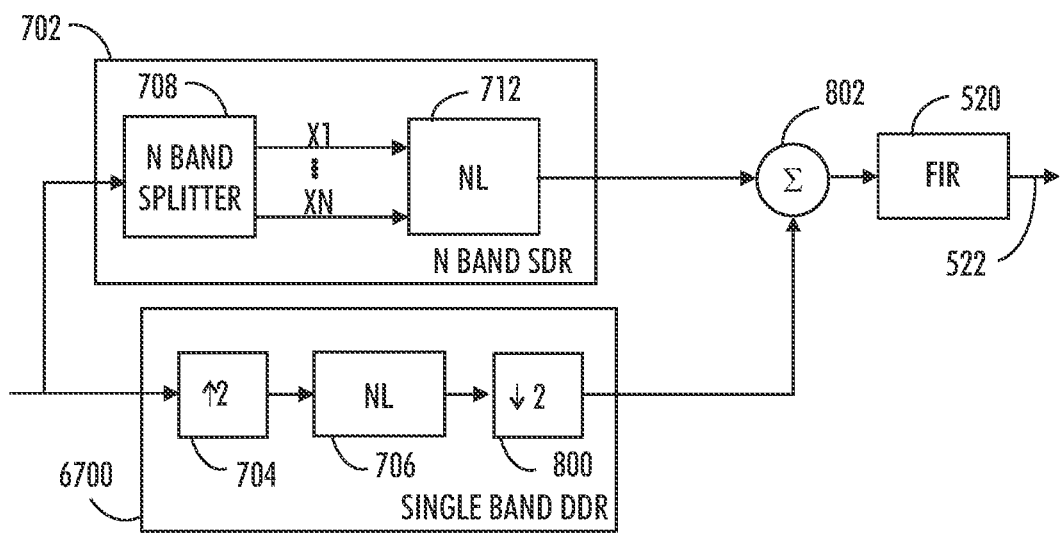

In an example embodiment, similar performance as in the apparatus of FIG. 7 is achieved with the apparatus of FIG. 8. In the apparatus of FIG. 8, the combining of the predistortion circuits 700, 702 is performed a SDR rate, i.e, both linear, composite, and special (cross) terms are rate matched to SDR.

After the non-linear block 706, the predistortion circuit 700 comprises a decimator 800. The cross terms in predistortion circuit 702 output an SDR signal. In this example, the However, the linear and composite terms (NL_term1) are still operating at DDR rates. Thus, the DDR signal will be filtered and decimated to produce a SDR rate. It is then added 802 to the cross terms from block 802 that are already SDR. Since the filtering operation at block 800 occurs at a higher sample rate all IMs that alias would be filtered out. Therefore, pre-distortion signal output 522 is alias free at a SDR rate.

In an example embodiment, the decimation operations 800 can be implemented in two ways. First, the IMs could alias are filtered and decimated. This generates a SDR phase 0 signal. Second, a polyphase filtering approach may be applied. There both phases are used to produce an output phase of 0 or 1. Generating merely an output phase 0 is equivalent to the first decimation process.

Following Eq.18 describes the operation of apparatus of FIG. 8.

$$\text{PreD}_{SDR} = \text{decimate}(f[(\overline{L_0}*\overline{x_0(n)} + \overline{L_1}*\overline{x_1(n)}) + \overline{C_0}*NL_{term10} + \overline{C_1}*NL_{term11}]) + \overline{C_3}*NL_{SDR} \quad (18)$$

Here, the DDR parts are filtered and decimated before being added to SDR cross terms. $\overline{L_0}, \overline{L_1}, \overline{C_0}, \overline{C_1}, \overline{C_3}, \ldots$ are coefficient vectors. Other terms are the same as in Eq.17.

The DPD coefficients may be computed in various ways. For example, iterative algorithms or a Least Squares methodology may be applied. Solution can be DDR based or DDR/SDR based (subsampled solver). One skilled in the art is aware of these methods.

Above examples and equations apply to DDR. However, as one skilled in the art is well aware, the same concepts can be extended to other rates, for example to quad data rate, QDR, of the linear and the composite non-linear terms of FIG. 3C where the cross and special terms can still be SDR.

Figure 9A:
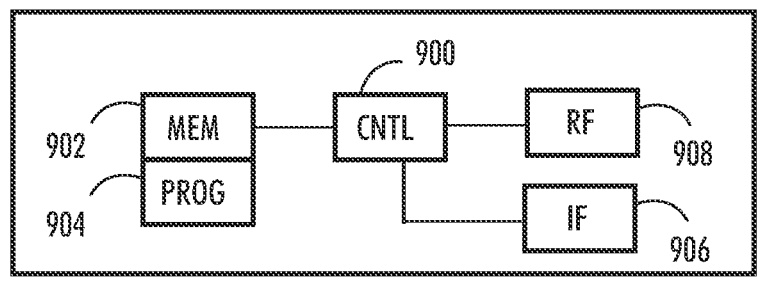
FIGS. 9A and 9B illustrate simplified examples of apparatuses applying some example embodiments of the invention.
Figure 9B:
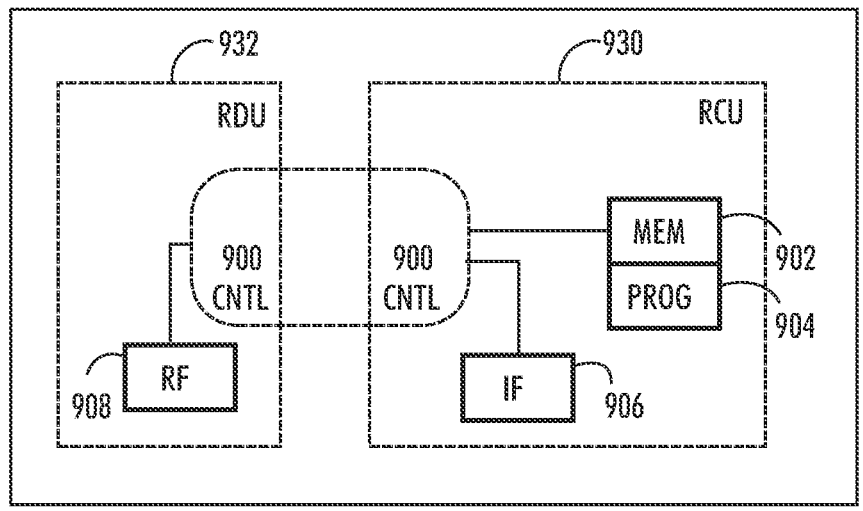

FIGS. 9A and 9B illustrate an example embodiment. The figures illustrate a simplified example of an apparatuses applying example embodiments of the invention.

It should be understood that the apparatuses are depicted herein as an example illustrating some embodiments. It is apparent to a person skilled in the art that the apparatuses may also comprise other functions and/or structures and not all described functions and structures are required. Although the apparatuses has been depicted as one entity, different modules and memory may be implemented in one or more physical or logical entities.

FIG. 9A illustrates an apparatus or network element applying example embodiments of the invention. In some example embodiments, the apparatus may be a network element or a part of a network element. In some example embodiments, the apparatus may comprise several network entities connected to each other. In an example embodiment, the apparatus may be a base station or a part of a base station or a gNB or a part of a gNB.

The apparatus 900 of the example includes a control circuitry 900 configured to control at least part of the operation of the apparatus.

The apparatus may comprise a memory 902 for storing data. Furthermore, the memory may store software 904 executable by the control circuitry 900. The memory may be integrated in the control circuitry.

The apparatus further comprises one or more interface circuitries 906, 908 configured to connect the apparatus to other devices and to network elements of the radio access network. The interface 906 may provide a wired or wireless connection.

The interface may provide a connection to other similar network elements or core network. The interface 908 may provide a wireless connection for example to terminal devices or UEs. The interface may comprise a transmitter or a transceiver with a power amplifier and a predistortion circuit.

In an example embodiment, the software 904 may comprise a computer program comprising program code means adapted to cause the control circuitry 900 of the apparatus to control the apparatus to realise at least some of the example embodiments described above.

In an example embodiment, at least some of the functionalities of the network element apparatus of FIG. 9A of may be shared between two physically separate devices, forming one operational entity. Therefore, the apparatus may be seen to depict the operational entity comprising one or more physically separate devices for executing at least some of the described processes. Thus, the apparatus of FIG. 9B, utilizing such shared architecture, may comprise a remote control unit RCU 930, such as a host computer or a server computer, operatively coupled (e.g. via a wireless or wired network) to a remote distributed unit RDU 932 located in the base station. In an embodiment, at least some of the described processes may be performed by the RCU 930. In an embodiment, the execution of at least some of the described processes may be shared among the RDU 932 and the RCU 930.

In an example embodiment, the RCU 930 may generate a virtual network through which the RCU 930 communicates with the RDU 932. In general, virtual networking may involve a process of combining hardware and software network resources and network functionality into a single, software-based administrative entity, a virtual network. Network virtualization may involve platform virtualization, often combined with resource virtualization. Network virtualization may be categorized as external virtual networking which combines many networks, or parts of networks, into the server computer or the host computer (e.g. to the RCU). External network virtualization is targeted to optimized network sharing. Another category is internal virtual networking which provides network-like functionality to the software containers on a single system. Virtual networking may also be used for testing the terminal device.

In an example embodiment, the virtual network may provide flexible distribution of operations between the RDU and the RCU. In practice, any digital signal processing task may be performed in either the RDU or the RCU and the boundary where the responsibility is shifted between the RDU and the RCU may be selected according to implementation.

The steps and related functions described in the above and attached figures are in no absolute chronological order, and some of the steps may be performed simultaneously or in an order differing from the given one. Other functions can also be executed between the steps or within the steps. Some of the steps can also be left out or replaced with a corresponding step.

The apparatuses or controllers able to perform the above-described steps may be implemented as an electronic digital computer, processing system or a circuitry which may comprise a working memory (random access memory, RAM), a central processing unit (CPU), and a system clock. The CPU may comprise a set of registers, an arithmetic logic unit, and a controller. The processing system, controller or the circuitry is controlled by a sequence of program instructions transferred to the CPU from the RAM. The controller may contain a number of microinstructions for basic operations. The implementation of microinstructions may vary depending on the CPU design. The program instructions may be coded by a programming language, which may be a high-level programming language, such as C, Java, etc., or a low-level programming language, such as a machine language, or an assembler. The electronic digital computer may also have an operating system, which may provide system services to a computer program written with the program instructions.

As used in this application, the term 'circuitry' refers to all of the following: (a) hardware-only circuit implementations, such as implementations in only analog and/or digital circuitry, and (b) combinations of circuits and software (and/or firmware), such as (as applicable): (i) a combination of processor(s) or (ii) portions of processor(s)/software including digital signal processor(s), software, and memory(ies) that work together to cause an apparatus to perform various functions, and (c) circuits, such as a microprocessor(s) or a portion of a microprocessor(s), that require software or firmware for operation, even if the software or firmware is not physically present.

This definition of 'circuitry' applies to all uses of this term in this application. As a further example, as used in this application, the term 'circuitry' would also cover an implementation of merely a processor (or multiple processors) or a portion of a processor and its (or their) accompanying software and/or firmware. The term 'circuitry' would also cover, for example and if applicable to the particular element, a baseband integrated circuit or applications processor integrated circuit for a mobile phone or a similar integrated circuit in a server, a cellular network device, or another network device.

An embodiment provides a computer program embodied on a distribution medium, comprising program instructions which, when loaded into an electronic apparatus, are configured to control the apparatus to execute the embodiments described above.

The computer program may be in source code form, object code form, or in some intermediate form, and it may be stored in some sort of carrier, which may be any entity or device capable of carrying the program. Such carriers include a record medium, computer memory, read-only memory, and a software distribution package, for example. Depending on the processing power needed, the computer program may be executed in a single electronic digital computer or it may be distributed amongst a number of computers.

The apparatus may also be implemented as one or more integrated circuits, such as application-specific integrated circuits, ASIC. Other hardware embodiments are also feasible, such as a circuit built of separate logic components. A hybrid of these different implementations is also feasible. When selecting the method of implementation, a person skilled in the art will consider the requirements set for the size and power consumption of the apparatus, the necessary processing capacity, production costs, and production volumes, for example.

It will be obvious to a person skilled in the art that, as the technology advances, the inventive concept can be implemented in various ways. The invention and its embodiments are not limited to the examples described above but may vary within the scope of the claims.

The invention claimed is:

1. An apparatus, comprising:
   at least one processor; and
   at least one memory including computer program code,
   the at least one memory and the computer program code configured to, with the at least one processor, cause the apparatus at least to perform:
   receive as an input a signal comprising at least two signal components, each signal component being received on a different frequency band;
   sample the input signal at a given sample frequency fs, the signal comprising linear terms, composite non-linear terms causing intermodulation outside Nyquist band of ±fs/2 of the input signal and further non-linear terms causing intermodulation inside the Nyquist band, the further non-linear terms comprising multi-band terms;
   apply oversampling by a given factor and creating at least one additional phase to the input signal in a first predistortion circuit for processing the linear terms and composite non-linear terms causing intermodulation outside Nyquist band;
   process the input signal without oversampling in a second predistortion circuit in parallel with the first predistortion circuit for the further non-linear terms causing intermodulation inside the Nyquist band;
   match the rates of the output signals of the first and second predistortion circuits;
   combine and filter the output signals of the first and second predistortion circuits to obtain a pre-distorted signal for a power amplifier.

2. The apparatus of claim 1, the at least one memory and the computer program code configured to, with the at least one processor, cause the apparatus further to perform:
   match the rates of the output signals of the first and second predistortion circuits by oversampling by the given factor the output signal of the second predistortion circuit for minimizing resources of the predistortion circuits by avoiding oversampling inside the second predistortion circuit.

3. The apparatus of claim 1, the at least one memory and the computer program code configured to, with the at least one processor, cause the apparatus further to perform:
   match the rates of the output signals of the first and second predistortion circuits by decimating with the inverse of the given factor the output signal of the first predistortion circuit for minimizing resources of the predistortion circuits by avoiding oversampling inside the second predistortion circuit.

4. The apparatus of claim 1, wherein the given factor is two, three or four.

5. The apparatus of claim 1, wherein the apparatus is at least in part realised with an application-specific integrated circuit or a field programmable gate array, and the number of further non-linear terms causing intermodulation is selected based on the available processing resources of the circuit or the array.

6. A method, in an apparatus, comprising:
   receiving as an input a signal comprising at least two signal components, each signal component being received on a different frequency band;
   sampling the input signal at a given sample frequency fs, the signal comprising linear terms, composite non-linear terms causing intermodulation outside Nyquist band of ±fs/2 of the input signal and further non-linear terms causing intermodulation inside the Nyquist band, the further non-linear terms comprising multi-band terms;
   applying oversampling by a given factor and creating at least one additional phase to the input signal in a first predistortion circuit for processing the linear terms and composite non-linear terms causing intermodulation outside Nyquist band;
   processing the input signal without oversampling in a second predistortion circuit in parallel with the first predistortion circuit for the further non-linear terms causing intermodulation inside the Nyquist band;
   matching the rates of the output signals of the first and second predistortion circuits;
   combining and filtering the output signals of the first and second predistortion circuits to obtain a pre-distorted signal for a power amplifier.

7. The method of claim 6, further comprising:
   matching the rates of the output signals of the first and second predistortion circuits by oversampling by the given factor the output signal of the second predistortion circuit for minimizing resources of the predistortion circuits by avoiding oversampling inside the second predistortion circuit.

8. The method of claim 6, further comprising:
   matching the rates of the output signals of the first and second predistortion circuits by decimating with the inverse of the given factor the output signal of the first predistortion circuit for minimizing resources of the predistortion circuits by avoiding oversampling inside the second predistortion circuit.

9. The method of claim 6, wherein the given factor is two, three or four.

10. The method of claim 1, wherein the apparatus is at least in part realised with an application-specific integrated circuit or a field programmable gate array, the method comprising:
    selecting the number of further non-linear terms causing intermodulation based on the available processing resources of the circuit or the array.

11. A non-transitory computer program embodied on a distribution medium, comprising program instructions which, when loaded into an electronic apparatus, are configured to control the apparatus to execute at least the following:
    receiving as an input a signal comprising at least two signal components, each signal component being received on a different frequency band;
    sampling the input signal at a given sample frequency fs, the signal comprising linear terms, composite non-linear terms causing intermodulation outside Nyquist band of ±fs/2 of the input signal and further non-linear terms causing intermodulation inside the Nyquist band, the further non-linear terms comprising multi-band terms;
    applying oversampling by a given factor and creating at least one additional phase to the input signal in a first predistortion circuit for processing the linear terms and composite non-linear terms causing intermodulation outside Nyquist band;
    processing the input signal without oversampling in a second predistortion circuit in parallel with the first predistortion circuit for the further non-linear terms causing intermodulation inside the Nyquist band;
    matching the rates of the output signals of the first and second predistortion circuits;
    combining and filtering the output signals of the first and second predistortion circuits to obtain a pre-distorted signal for a power amplifier.

* * * * *